US010790168B2

(12) United States Patent
Shim et al.

(10) Patent No.: US 10,790,168 B2
(45) Date of Patent: Sep. 29, 2020

(54) PLASMA TREATMENT APPARATUS AND METHOD OF FABRICATING SEMICONDUCTOR DEVICE USING THE SAME

(71) Applicant: Samsung Electronics Co., Ltd., Suwon-si, Gyeonggi-do (KR)

(72) Inventors: Seung Bo Shim, Seoul (KR); Hyuk Kim, Seongnam-si (KR); Sun Taek Lim, Seongnam-si (KR); Jae Myung Choe, Seoul (KR); Jeon Il Lee, Suwon-si (KR); Sung-Il Cho, Seoul (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 32 days.

(21) Appl. No.: 15/972,350

(22) Filed: May 7, 2018

(65) Prior Publication Data

US 2019/0122903 A1    Apr. 25, 2019

(30) Foreign Application Priority Data

Oct. 25, 2017  (KR) .................. 10-2017-0139481

(51) Int. Cl.
*H01L 21/67*     (2006.01)
*H01L 21/683*    (2006.01)
(Continued)

(52) U.S. Cl.
CPC .. *H01L 21/67069* (2013.01); *H01J 37/32091* (2013.01); *H01J 37/32146* (2013.01);
(Continued)

(58) Field of Classification Search
CPC ........... H01L 21/6833; H01L 21/31116; H01L 21/67069; H01J 37/32715; H01J 37/32146; H01J 37/32091
(Continued)

(56) References Cited

U.S. PATENT DOCUMENTS 6,231,777 B1 *  5/2001  Kofuji ............... H01J 37/32706
                                                         216/71
7,951,262 B2    5/2011  Koshiishi et al.
(Continued)

OTHER PUBLICATIONS

Wikipedia, The Free Encyclopedia; "Plasma (physics)" via https://en.wikipedia.org/wiki/Plasma_(physics) ; pp. 1-21; 2019.*
(Continued)

*Primary Examiner* — Binh X Tran
(74) *Attorney, Agent, or Firm* — Muir Patent Law, PLLC

(57) ABSTRACT

Provided are a plasma treatment apparatus and a method of fabricating semiconductor device using the same. The plasma treatment apparatus includes a chamber which provides a plasma treatment space, a bottom electrode disposed in the chamber and supports a wafer, a top electrode disposed in the chamber facing the bottom electrode, a source power source which supplies a source power output of a first frequency to the bottom electrode, a bias power source which supplies a bias power output of a second frequency different from the first frequency to the bottom electrode, and a pulse power source which applies a pulse voltage to the bottom electrode, wherein the bias power output is a bias voltage which is pulse-modulated to a first voltage level in a first time section and pulse-modulated to a second voltage level in a second time section and is applied to the bottom electrode.

13 Claims, 13 Drawing Sheets

(51) Int. Cl.
*H01J 37/32* (2006.01)
*H01L 21/3065* (2006.01)
*H01L 21/311* (2006.01)

(52) U.S. Cl.
CPC .... *H01J 37/32715* (2013.01); *H01L 21/3065* (2013.01); *H01L 21/31116* (2013.01); *H01L 21/6833* (2013.01); *H01J 2237/3341* (2013.01); *H01J 2237/3347* (2013.01)

(58) Field of Classification Search
USPC ......... 438/711, 712, 729; 156/345.38, 345.4, 156/345.43, 345.44, 345.47
See application file for complete search history.

(56) References Cited

U.S. PATENT DOCUMENTS

| | | |
|---|---|---|
| 9,399,812 B2 | 7/2016 | Bodke et al. |
| 9,564,287 B2 | 2/2017 | Ohse et al. |
| 9,583,357 B1 | 2/2017 | Long et al. |
| 2010/0003827 A1* | 1/2010 | Kessels ................. C23C 16/402 438/719 |
| 2012/0052689 A1 | 3/2012 | Tokashiki |
| 2015/0000843 A1 | 1/2015 | Koshiishi et al. |
| 2016/0064194 A1 | 3/2016 | Tokashiki et al. |
| 2016/0079037 A1 | 3/2016 | Hirano et al. |
| 2017/0098527 A1* | 4/2017 | Kawasaki ......... H01J 37/32091 |
| 2019/0066979 A1* | 2/2019 | Shoeb ................. H01J 37/321 |

OTHER PUBLICATIONS

Wikipedia, "Electric Power" via https://en.wikipedia.org/wiki/Electric_power ; pp. 1-6; 2020.*
Wikepedia, "Ground (electricity)" via https://en.wikipedia.org/wiki/Ground_(electricity); pp. 1-10; 2020.*
Nick Davis, "An Introduction to Ground: Earth Ground, Common Ground, Analog Ground, and Digital Ground", via https://www.allaboutcircuits.com/technical-articles/an-introduction-to-ground/ ; pp. 1-13; Jun. 18, 2019.*

* cited by examiner

PLASMA TREATMENT APPARATUS AND METHOD OF FABRICATING SEMICONDUCTOR DEVICE USING THE SAME

CROSS-REFERENCE TO RELATED APPLICATION

This application claims the benefit of Korean Patent Application No. 10-2017-0139481, filed on Oct. 25, 2017, in the Korean Intellectual Property Office, the disclosure of which is incorporated herein in its entirety by reference.

FIELD

The present inventive concept relates to a plasma treatment apparatus and a method of fabricating a semiconductor device using the same.

BACKGROUND

Recently, a system for accelerating a desired chemical reaction (such as deposition or etching) by using plasma is variously used in the semiconductor manufacturing industry.

For example, in the case of plasma etching, the system may be used to form a pattern on a semiconductor wafer. As semiconductor devices become more highly integrated, an aspect ratio of a trench formed by a pattern increases. During a plasma etching process, ion particles incident on the bottom or sides of a trench having a high aspect ratio may cause accumulation of positive (+) charges and bring about a loading effect that reduces the incidence rate of ion particles entering the trench for etching.

SUMMARY

Aspects of the inventive concept provide a plasma treatment apparatus capable of reducing a loading effect.

Aspects of the inventive concept also provide a method of fabricating a semiconductor device using a plasma treatment apparatus capable of reducing a loading effect.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to an aspect of the inventive concept, there is provided a plasma treatment apparatus including a chamber which provides a plasma treatment space, a bottom electrode disposed in the chamber, wherein the bottom electrode supports a wafer, a top electrode disposed in the chamber facing the bottom electrode, a source power source which supplies a source power output of a first frequency to the bottom electrode, a bias power source which supplies a bias power output of a second frequency different from the first frequency to the bottom electrode, and a pulse power source which applies a pulse voltage to the bottom electrode, wherein the bias power output is a bias voltage which is pulse-modulated to a first voltage level in a first time section and pulse-modulated to a second voltage level in a second time section and is applied to the bottom electrode.

According to another aspect of the inventive concept, there is provided a plasma treatment apparatus including a chamber which provides a plasma treatment space, a bottom electrode which is disposed in the chamber, wherein the bottom electrode supports a wafer, a top electrode which is disposed in the chamber facing the bottom electrode, a source power source which generates a plasma in the chamber by applying a source voltage of a first voltage level to the bottom electrode in a first time section, a bias power source which supplies a bias power output to the bottom electrode, wherein the bias power source causes ions contained in the plasma to be incident on the wafer by applying a bias voltage of a second voltage level to the bottom electrode in the first time section and applying a bias voltage of a third voltage level lower than the second voltage level to the bottom electrode in a second time section; and a pulse power source which causes electrons contained in the plasma to be incident on the wafer by applying a pulse voltage to the bottom electrode in the second time section.

According to another aspect of the inventive concept, there is provided a method of fabricating a semiconductor device including providing a gas into a chamber in which a wafer is placed on a bottom electrode, causing ions contained in a plasma generated from the gas to be incident on the wafer by applying a source voltage of a first voltage level and a bias voltage of a second voltage level to the bottom electrode in a first time section, and causing electrons contained in the plasma to be incident on the wafer by applying a source voltage of a third voltage level, a bias voltage of a fourth voltage level, and a pulse voltage to the plasma chamber in a second time section.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
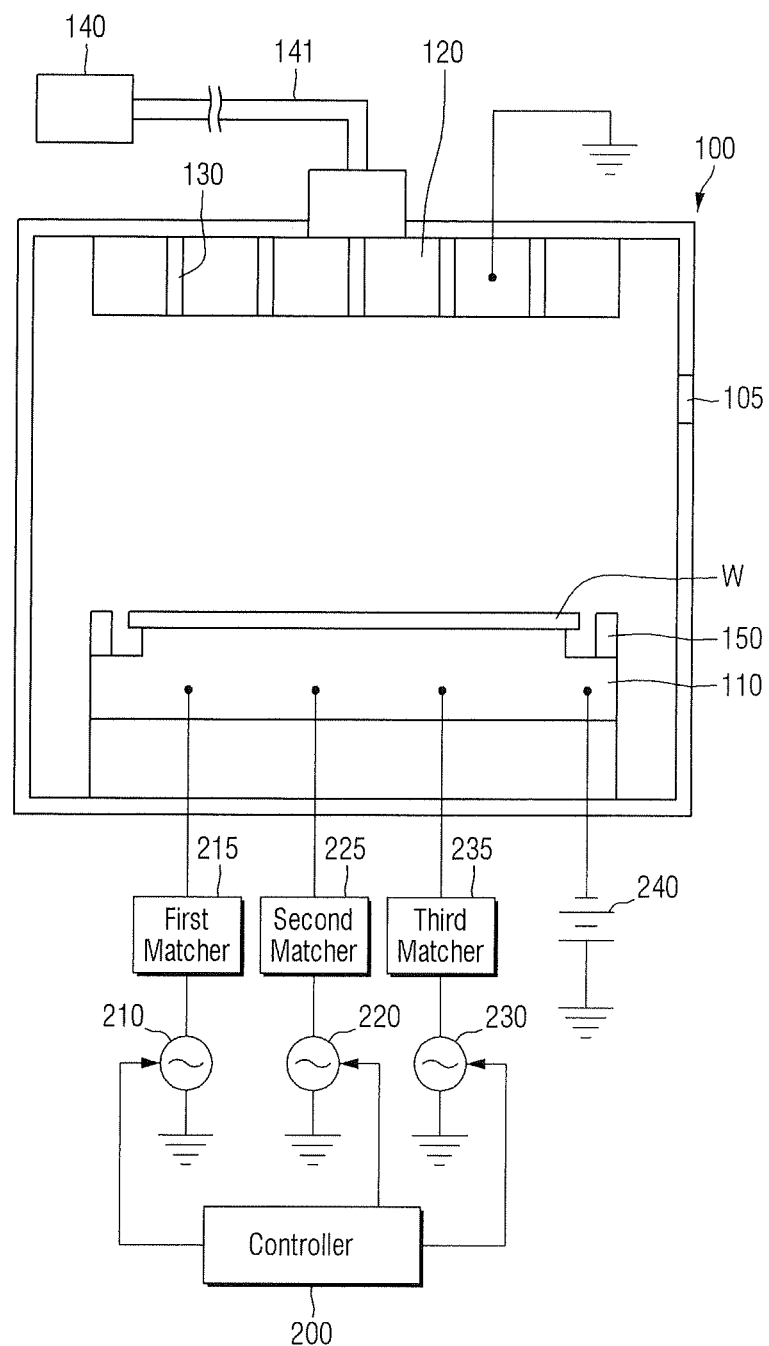
FIG. 1 is a conceptual diagram of a plasma treatment apparatus according to embodiments.

FIG. 1 is a conceptual diagram of a plasma treatment apparatus according to embodiments.

Referring to FIG. 1, the plasma treatment apparatus according to the embodiments includes a plasma chamber 100, a bottom electrode 110, a top electrode 120, a source power source 210, a bias power source 220, and a pulse power source 230.

The plasma chamber 100 may be supplied with a mixed gas from a gas supply 140. Plasma may be generated from the mixed gas supplied to the plasma chamber 100. The plasma chamber 100 may be a space in which a wafer W is treated with the formed plasma. In some embodiments, a deposition process, an etching process, etc. may be performed on the wafer W within the plasma chamber 100.

Process conditions such as temperature and pressure inside the plasma chamber 100 may be controlled. For example, pressure conditions may be controlled using an outlet 105 formed in an inner wall of the plasma chamber 100. The outlet 105 may control the pressure conditions inside the plasma chamber 100 by discharging the gas in the plasma chamber 100 during a plasma process.

When a plasma treatment process is terminated, the outlet 105 may discharge the gas used for plasma.

In some embodiments, the plasma chamber 100 may perform plasma treatment in a capacitively coupled plasma (CCP) manner. Therefore, ions or electrons generated in the plasma chamber 100 may move in an up-and-down direction of FIG. 1.

The bottom electrode 110 may support the wafer W. The bottom electrode 110 may be an electrostatic chuck. The bottom electrode 110 may have, but not limited to, a circular planar shape to support the circular wafer W. The pulse power source 230, the source power source 210, and the bias power source 220 may be connected to the bottom electrode 110. This will be described in detail later.

The bottom electrode 110 may be electrically connected to a direct current (DC) power source 240. The DC power source 240 may generate a tensile force for the wafer W on the bottom electrode 110 so that the wafer W is fixed on the bottom electrode 110.

The top electrode 120 may be disposed within the plasma chamber 100. The top electrode 120 may be disposed above the wafer W and the bottom electrode 110 supporting the wafer W facing the bottom electrode 110.

In some embodiments, the top electrode 120 may be a showerhead that supplies a mixed gas into the plasma chamber 100. The top electrode 120 may discharge a gas supplied from the gas supply 140 through a plurality of openings 130 formed in the surface of the top electrode 120.

The gas supply 140 stores gas supplied for a plasma treatment performed in the plasma chamber 100. The gas supply 140 may supply the gas to the plasma chamber 100 through a gas supply line 141, upon request.

The gas supply 140 and the gas supply line 141 are not necessarily disposed above the chamber 100 as illustrated in FIG. 1. The positions of the gas supply 140 and the gas supply line 141 may be different from those in FIG. 1, depending on the structure, position, etc. of the plasma chamber 100.

In FIG. 1, the top electrode 120 may be connected to, for example, a ground power source. However, embodiments are not limited thereto. The top electrode 120 may, in some embodiments, be electrically connected to a power source that supplies a radio frequency (RF) power output or DC power output.

A focus ring 150 may be disposed adjacent to sides of the wafer W. The focus ring 150 may include a conductor. The focus ring 150 may be provided to adjust a potential for inputting plasma. The focus ring 150 may include the same material (e.g., silicon) as the wafer W and prevent plasma from being concentrated on an outer circumferential surface of the wafer W by extending the surface of the wafer W during a plasma treatment process on the wafer W.

The pulse power source 230, the source power source 210 and the bias power source 220 may be electrically connected to the bottom electrode 110.

Specifically, the pulse power source 230 may be connected to the bottom electrode 110 by a first matcher 235. An end of the pulse power source 230 may be connected to the first matcher 235, and the other end of the pulse power source 230 may be connected to the ground power source. However, embodiments are not limited thereto, and the other end of the pulse power source 230 can also be connected to another power source. The pulse power source 230 may provide a pulse power output to the bottom electrode 110.

The first matcher 235 may perform impedance matching between an electric circuit, which is formed by the top electrode 120 and the bottom electrode 110 in a plasma treatment process performed in the plasma chamber 100, and the pulse power source 230. Here, 'impedance matching' refers to matching the impedance of a power source to the impedance of a load.

That is, a reflected power output of the electric circuit formed by the top electrode 120 and the bottom electrode 110 in the plasma treatment process needs to be minimized. In other words, the greater the reflected power output generated from the electric circuit formed by the top electrode 120 and the bottom electrode 110, the smaller the total output for plasma formation. The reflected power output can be minimized by matching the impedance of the electric circuit formed by the top electrode 120 and the bottom electrode 110 to the impedance of the pulse power source 230. The first matcher 215 may perform impedance matching by, for example, adjusting the capacitance of a capacitor included in the first matcher 215.

The source power source 210 may be connected to the bottom electrode 110 by a second matcher 215. An end of the source power source 210 may be connected to the second matcher 215, and the other end of the source power source 210 may be connected to the ground power source. However, embodiments are not limited thereto, and the other end of the source power source 210 can also be connected to another power source. The second matcher 215 may perform impedance matching between the electric circuit formed by the top electrode 120 and the bottom electrode 110 and the source power source 210.

The bias power source 220 may be connected to the bottom electrode 110 by a third matcher 225. An end of the bias power source 220 may be connected to the third matcher 225, and the other end of the bias power source 220 may be connected to the ground power source. However, embodiments are not limited thereto, and the other end of the bias power source 220 can also be connected to another power source. The third matcher 225 may perform impedance matching between the electric circuit formed by the top electrode 120 and the bottom electrode 110 and the bias power source 220.

A controller 200 may be connected to the pulse power source 230, the source power source 210, and the bias power source 220. The controller 200 may control the operation of the power sources 210 through 230 to be described with reference to FIGS. 2 through 4.

Figure 2:
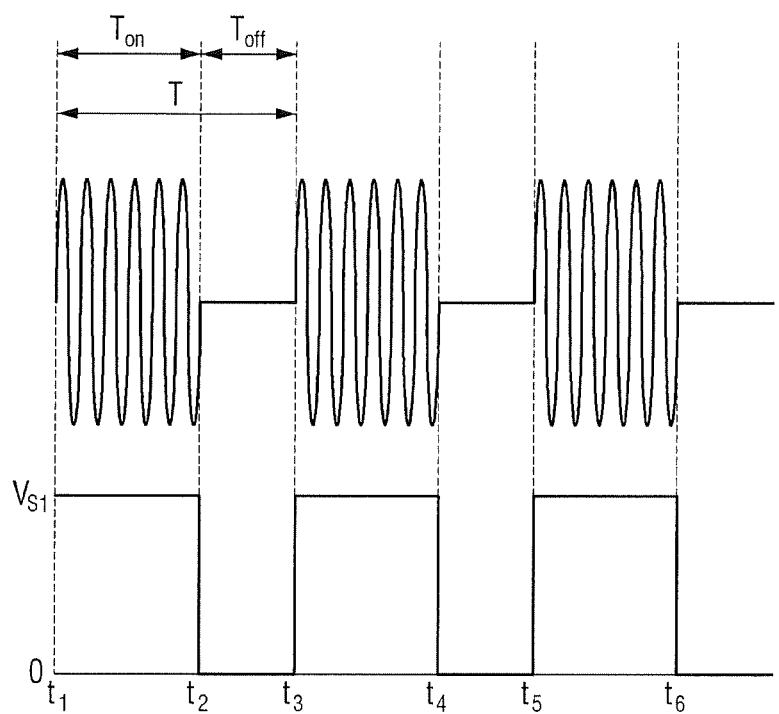
FIG. 2 is a timing diagram for explaining the operation of a source power source included in the plasma treatment apparatus of FIG. 1.

FIG. 2 is a timing diagram for explaining the operation of the source power source 210 included in the plasma treatment apparatus of FIG. 1.

Referring to FIG. 2, the source power source 210 may generate RF power output of a first frequency. The first frequency may be, for example, about 100 MHz to about 200

MHz. The RF power output of the first frequency generated by the source power source 210 may be pulse-modulated under the control of the controller 200 and then supplied to the bottom electrode 110 in the form of a square wave of a period T.

Specifically, the source power source 210 may apply a source voltage to the bottom electrode 110 in the form of a square wave which is a first turn-on voltage $V_{S1}$ in a first section $T_{on}$ and a first turn-off voltage (zero) in a second section $T_{off}$. In some embodiments, the first turn-off voltage may be zero.

The source power source 210 may generate a source voltage which is $V_{S1}$ at a first time $t_1$ and zero at a second time $t_2$. Then, the voltage generating operation of the source power source 210 is repeated from a third time $t_3$ to a sixth time $t_6$. A graph of the source voltage generated by the source power source 210 after the sixth time $t_6$ is not illustrated.

Since the source power source 210 generates a source voltage in the form of a square wave, the period T may be less than an oscillation period of the RF power output generated by the source power source 210. The period T may be, but is not limited to, about 1 μs.

A duty cycle of the source voltage generated by the source power source 210 may be, for example, about 50% to about 75%. The duty cycle may be defined as the proportion of time during which the source voltage is in the state of the first turn-on voltage $V_{S1}$ in the period T in which the source voltage has the first turn-on voltage $V_{s1}$ and the first turn-off voltage.

The source power source 210 may generate radicals in the gas supplied into the plasma chamber 100 by applying a source voltage to the bottom electrode 110 in the form of a square wave illustrated in FIG. 2.

Figure 3:
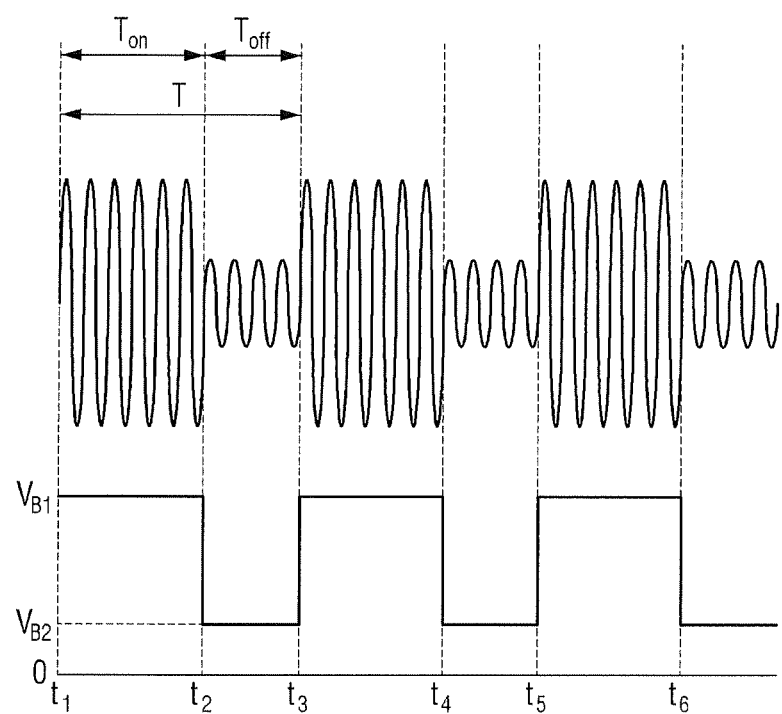
FIG. 3 is a timing diagram for explaining the operation of a bias power source included in the plasma treatment apparatus of FIG. 1.

FIG. 3 is a timing diagram for explaining the operation of the bias power source 220 included in the plasma treatment apparatus of FIG. 1.

Referring to FIG. 3, the bias power source 220 may generate an RF power output of a second frequency. In some embodiments, the second frequency may be lower than the first frequency. The second frequency may be, but is not limited to, about 2 MHz to about 10 MHz.

The RF power output of the second frequency generated by the bias power source 220 may be pulse-modulated under the control of the controller 200 and then supplied to the bottom electrode 110 in the form of a square wave of a period T.

The period T of the source voltage provided from the source power source 210 to the bottom electrode 110 and the period T of the bias voltage provided from the bias power source 220 to the bottom electrode 110 may be synchronized with each other.

Therefore, the bias power source 220 may apply a bias voltage to the bottom electrode 110 in the form of a square wave which is a second turn-on voltage $V_{B1}$ in the first section $T_{on}$ and a second turn-off voltage $V_{B2}$ in the second section $T_{off}$. In some embodiments, the second turn-off voltage $V_{B2}$ may be equal to or greater than zero. When the second turn-off voltage $V_{B2}$ is greater than zero in the second section $T_{off}$, it may mean that the bias power source 220 is not completely turned off in the second section $T_{off}$.

The bias power source 220 may generate a bias voltage having a first level $V_{B1}$ at the first time $t_1$ and a second level $V_{B2}$ at the second time $t_2$. Then, the operation of the bias power source 220 is repeated from the third time $t_3$ to the sixth time $t_6$. A graph of the bias power output generated by the bias power source 220 after the sixth time $t_6$ is not illustrated.

As described above, the period T of the bias voltage generated by the bias power source 220 may be synchronized with the period T of the source voltage generated by the source power source 210. The period T may be less than an oscillation period of the RF power output generated by a voltage source included in the bias power source 220. The period T may be, for example, about 1 ms.

The bias power source 220 may apply a bias voltage, which is an ion extraction voltage, to the wafer W. A plasma etching process performed by the plasma treatment apparatus according to the embodiments may use an ion extraction voltage of, e.g., about 200 V to about 1000 V. The bias power source 220 may extract ions from plasma by applying the ion extraction voltage to the wafer W through the bottom electrode 110, so that the extracted ions can be incident on the wafer W.

Figure 4:
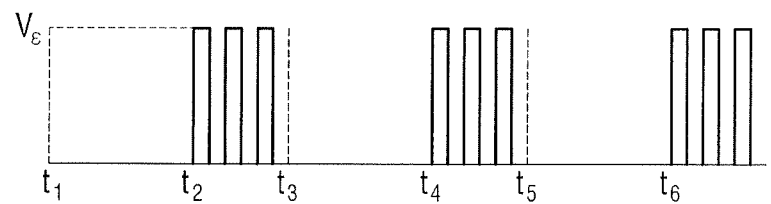
FIG. 4 is a timing diagram for explaining the operation of a pulse power source included in the plasma treatment apparatus of FIG. 1.

FIG. 4 is a timing diagram for explaining the operation of the pulse power source 230 included in the plasma treatment apparatus of FIG. 1.

The pulse power source 230 may be a DC pulse voltage source which applies a pulse voltage to the bottom electrode 110. Specifically, the pulse power source 230 may apply a pulse voltage to the wafer W through the bottom electrode 110 in the second section $T_{off}$. Therefore, a section in which the pulse power source 230 applies a pulse voltage to the bottom electrode 110 corresponds to the second section $T_{off}$ in which both the source power source 210 and the bias power source 220 provide a turn-off voltage to the bottom electrode 110.

The pulse power source 230 is maintained at zero in the first section $T_{on}$. Therefore, the pulse power source 230 is maintained at zero between the first time $t_1$ and the second time $t_2$. After the second time $t_2$, the pulse power source 230 applies a pulse voltage of a third voltage level $V_E$ to the bottom electrode 110.

The pulse power source 230 may apply a pulse to the bottom electrode 110 at least once in the second section $T_{off}$. Therefore, the pulse power source 230 can apply a plurality of pulses to the bottom electrode 110 during one period T and can apply a turn-on voltage ($V_E$) and a turn-off voltage to the bottom electrode 110 a plurality of times in the second section $T_{off}$.

As described above, the source power source 210 may generate a plasma using a gas supplied into the plasma chamber 100, and the bias power source 220 causes ions to be incident on the wafer W using an ion extraction voltage. While the source power source 210 and the bias power source 220 are kept turned off in the second section $T_{off}$, the pulse power source 230 applies a pulse voltage to the bottom electrode 110, thereby causing electrons separated from the ions to be incident onto the wafer W.

Figure 5:
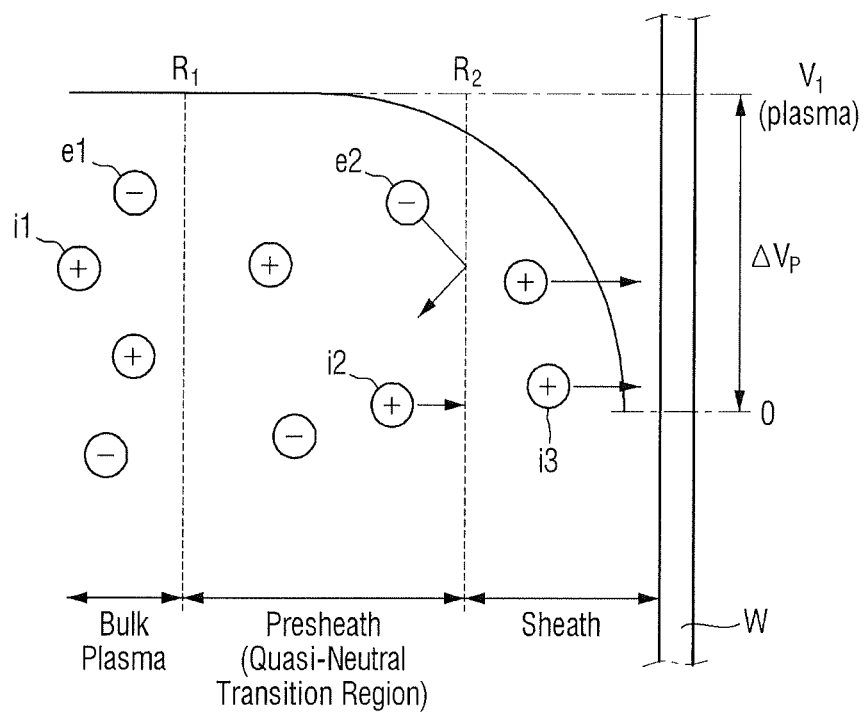
FIGS. 5 through 7 are conceptual diagrams for explaining the operation of the plasma treatment apparatus according to the embodiments.
Figure 6:
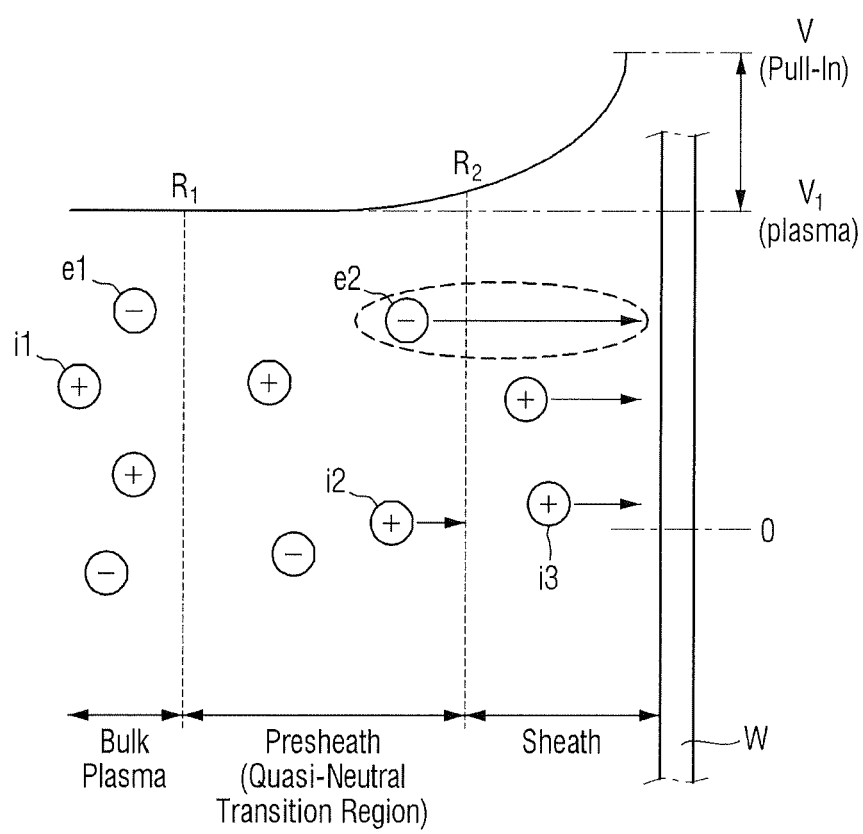
Figure 7:
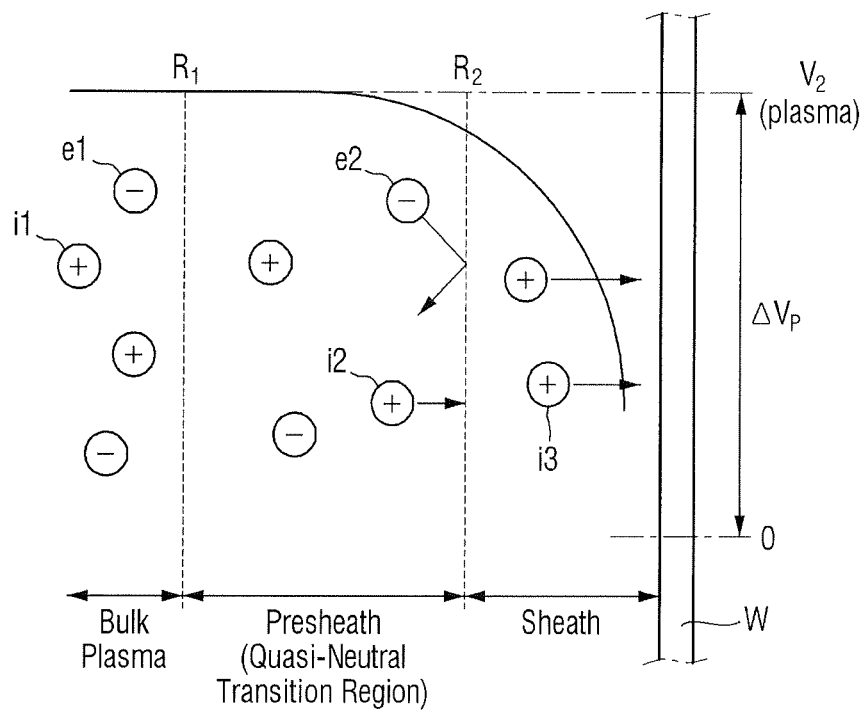

FIGS. 5 through 7 are conceptual diagrams for explaining the operation of the plasma treatment apparatus according to the embodiments.

Referring to the conceptual diagram of FIG. 5, plasma is formed in the plasma chamber 100, and ions are incident on the wafer W in the first section $T_{on}$.

Specifically, in the first section $T_{on}$, plasma is formed in the plasma chamber 100 by a source voltage applied from the source power source 210 to the bottom electrode 110. In FIG. 5, a region separated from the wafer W by a predetermined distance or more is represented by a first boundary $R_1$. A region between the first boundary $R_1$ separated from the wafer W by the predetermined distance or more and the top electrode 120 is defined as a bulk plasma region in which gas atoms are divided into ions i1 and electrons e1. A potential ΔV of the bulk plasma region may be maintained at a first potential $V_1$.

A presheath region, that is, a quasi-neutral transition region is formed between the first boundary $R_1$ and a second boundary $R_2$. A potential of the presheath region decreases from the first potential $V_1$ as the distance to the wafer W decreases but may still be greater than a threshold value. That is, a region in which the potential is greater than the threshold value may be defined as the presheath region.

Due to this potential, ions i2 in the presheath region can move to a sheath region, but electrons e2 in the presheath region cannot move to the sheath region.

The sheath region is defined between the second boundary $R_2$ and a top surface of the wafer W. A plasma sheath, which is a potential barrier formed by the surface of the wafer W, is formed in the sheath region. The ions that have moved from the presheath region to the sheath region may be accelerated onto the wafer W and may be used in an etching process for forming a pattern on the wafer W.

Since ions i3 are incident on the wafer W in the sheath region as illustrated in FIG. 5, an ion current flows toward the wafer W. That is, from a circuit perspective, the ion current may flow from the top electrode 120 to the bottom electrode 110.

Referring to FIG. 6, in the second (turn-off) section $T_{off}$, both the source power source 210 and the bias power source 220 are turned off, and the pulse power source 230 applies a pulse voltage to the bottom electrode 110.

A potential of the sheath region close to the wafer W is increased by the pulse voltage having a positive magnitude. The increased potential of the sheath region enables the electrons e2 of the presheath region to enter the sheath region. The electrons e2 entering the sheath region may be accelerated onto the wafer W.

While the electrons e2 are being made to be incident on the wafer W by the application of the pulse voltage, the ions i3 are also incident on the wafer W. The amount of the electrons e2 incident on the wafer W due to the pulse voltage is greater than the amount of the ions i3 incident on the wafer W. Accordingly, an electron current due to the electrons e2 is greater than the ion current. Thus, the electron current flows from the wafer W in the sheath region. That is, from a circuit perspective, the electron current may flow from the bottom electrode 110 to the top electrode 120.

In some embodiments, the electrons e2 accelerated onto the wafer W in the second section $T_{off}$ may help to reduce a loading effect due to ions in the etching process for forming a pattern on the wafer W. This will be described in detail later.

Referring to FIG. 7, the pulse power source 230 is turned off. Therefore, the potential of the sheath region close to the wafer W may become lower than the potential of the presheath region again.

Due to the lowered potential, the electrons e2 in the presheath region cannot move to the sheath region as in FIG. 6. Therefore, the ion current flows toward the wafer W. That is, from a circuit perspective, the ion current may flow from the top electrode 120 to the bottom electrode 110.

The ions i3 incident on the wafer W may be used in the etching process for forming a pattern on the wafer W.

Figure 8:
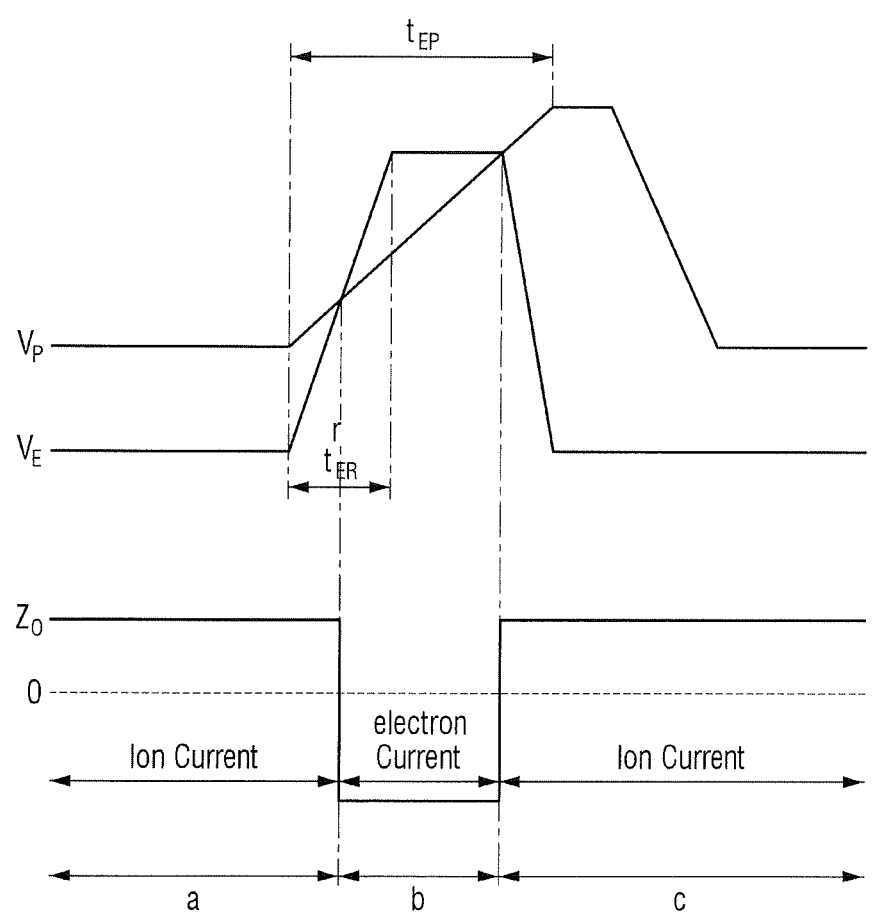
FIG. 8 is a timing diagram for explaining the operation of the plasma treatment apparatus according to the embodiments.

FIG. 8 is a timing diagram for explaining the operation of the plasma treatment apparatus according to the embodiments.

In FIG. 8, potentials before and after the pulse power source 230 applies a pulse voltage to the bottom electrode 110 are illustrated.

Section a refers to a section before the second time $t_2$, that is, before a pulse voltage is applied to the bottom electrode 110 by the pulse power source 230. Since electrons are prevented from reaching the wafer W or the sheath region by the potential as described above with reference to FIG. 5, only a current $I_0$ due to ions exists in section a. Here, the current $I_0$ is defined as a current flowing from the top electrode 120 to the bottom electrode 110 and having a positive magnitude.

When the pulse power source 230 applies a pulse voltage to the bottom electrode 110 at the second time $t_2$, a potential $V_E$ of the sheath region rises. A plasma potential $V_P$ also starts to rise at the second time $t_2$, but the potential $V_E$ of the sheath region rises faster than the plasma potential $V_P$. That is, a rising time $t_{ER}$ of the potential $V_E$ of the sheath region is less than a rising time $t_{PR}$ of the plasma potential $V_P$.

Here, the rising time may denote the time required for a potential to rise from a lowest point to a peak value. However, embodiments are not limited to this definition. For example, the time required for the potential to reach 50% of the peak value can also be defined as the rising time.

The rising time $t_{ER}$ of the potential $V_E$ of the sheath region and the rising time $t_{PR}$ of the plasma potential $V_P$ can also be described in terms of a rising speed of the potential $V_E$ of the sheath region and a rising speed of the plasma potential $V_P$, respectively. That is, an increase in the potential $V_E$ of the sheath region may be larger than that in the plasma potential $Y_P$ within a predetermined time (for example, 1 µs). In some embodiments, the rising speed of the potential $V_E$ of the sheath region may be about 2000 V/1 µs or more.

Due to the more rapidly rising potential $V_E$ of the sheath region, a section b in which the potential $V_E$ of the sheath region is higher than the plasma potential $V_P$ appears. This section b corresponds to a section in which an electron current is greater than an ion current as described above with reference to FIG. 6. In this section b, electrons are accelerated onto the wafer W, and the electron current flows from the bottom electrode 110 to the top electrode 120. Thus, the magnitude of the current may have a negative value.

Since the rising time $t_{ER}$ of the potential $V_E$ of the sheath region is less than the rising time $t_{PR}$ of the plasma potential $V_P$, electrons are incident on the wafer W. If the rising time $t_{ER}$ of the potential $V_E$ of the sheath region is not less than the rising time $t_{PR}$ of the plasma potential $V_P$, the plasma potential $V_P$ may increase faster. In this case, there may be no section in which the potential $V_E$ of the sheath region is greater than the plasma potential $V_P$. This will now be described in more detail with reference to FIG. 9.

Figure 9:
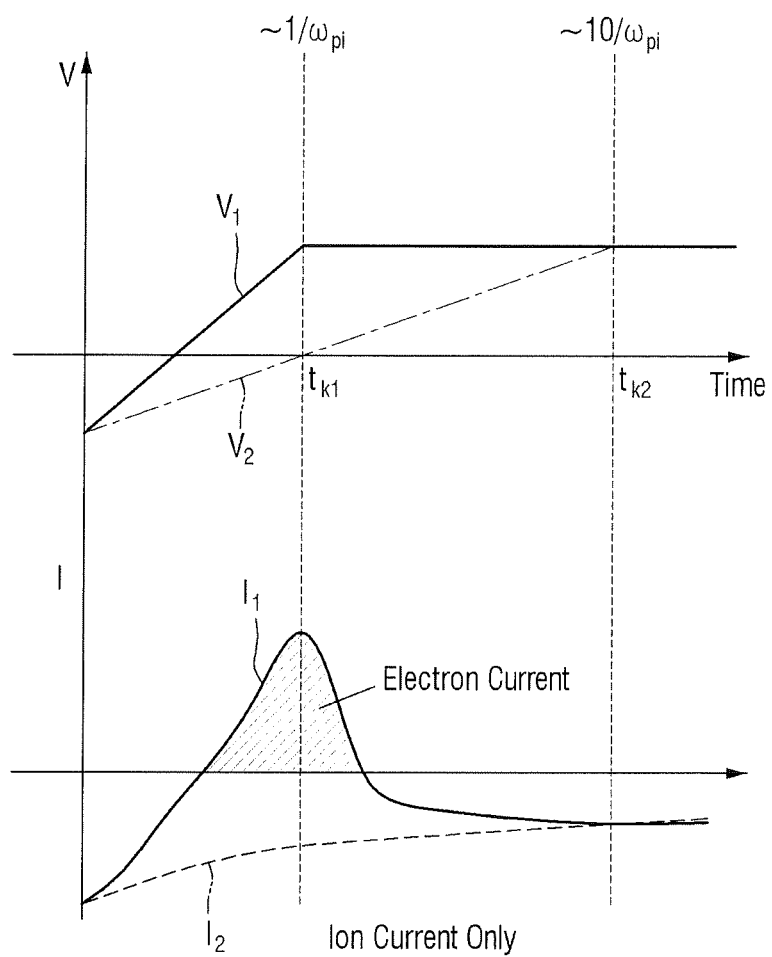
FIG. 9 is a graph illustrating a rising time of a sheath potential and a rising time of a plasma potential of FIG. 8.

FIG. 9 is a graph illustrating the rising time $t_{ER}$ of the sheath potential $V_E$ and the rising time $t_{PR}$ of the plasma potential $V_P$ of FIG. 8.

In FIG. 9, two increase curves $V_1$ and $V_2$ of the sheath potential $V_E$ are illustrated. One increase curve $V_1$ is a graph in a case where the rising time $t_{ER}$ of the sheath potential $V_E$ is a reciprocal of a plasma frequency $\omega_{pi}$, and the other increase curve $V_2$ is a graph in a case where the rising time $t_{ER}$ of the sheath potential $V_E$ is ten times the reciprocal of the plasma frequency $\omega_{pi}$.

The increase curve $V_1$ is based on the assumption that the rising time $t_{ER}$ of the potential $V_E$ of the sheath region is less than the rising time $t_{PR}$ of the plasma potential $V_P$. Conversely, the increase curve $V_2$ is based on the assumption that the rising time $t_{ER}$ of the potential $V_E$ of the sheath region is greater than the rising time $t_{PR}$ of the plasma potential $V_P$. Here, a rising time $t_{k1}$ of the increase curve $V_1$ is about 1 μs, and a rising time $t_{k2}$ of the increase curve $V_2$ is about 10 μs.

Graphs of an electron current $I_1$ and an ion current $I_2$ corresponding to the increase curves $V_1$ and $V_2$ of the sheath potential $V_E$ are also illustrated in FIG. 9. As described above, when the rising time $t_{ER}$ of the potential $V_E$ of the sheath region is less than the rising time $t_{PR}$ of the plasma potential $V_P$, the electron current $I_1$ flowing toward the top electrode 120 may be generated. Conversely, when the rising time $t_{ER}$ of the potential $V_E$ of the sheath region is greater than the rising time $t_{PR}$ of the plasma potential $V_P$, the ion current $I_2$ flowing toward the bottom electrode 110 may be generated.

Referring again to FIG. 8, when the application of the pulse voltage from the pulse power source 230 is stopped, the potential $V_E$ of the sheath region begins to decrease. Accordingly, a section in which the plasma potential $V_P$ begins to be greater than the potential $V_E$ of the sheath region appears. This section is illustrated as section c. In this section c, electrons cannot enter the sheath region due to the potential, and the ion current flows from the top electrode 120 to the bottom electrode 110. Thus, the magnitude of the current may have a positive value.

As described above, a pulse voltage applied from the pulse power source 230 to the bottom electrode 110 may cause electrons to be incident on the wafer W. The effects of the electrons incident on the wafer W will now be described in connection with a method of fabricating a semiconductor device using a plasma treatment apparatus according to embodiments of FIGS. 10 through 13.

Figure 10:
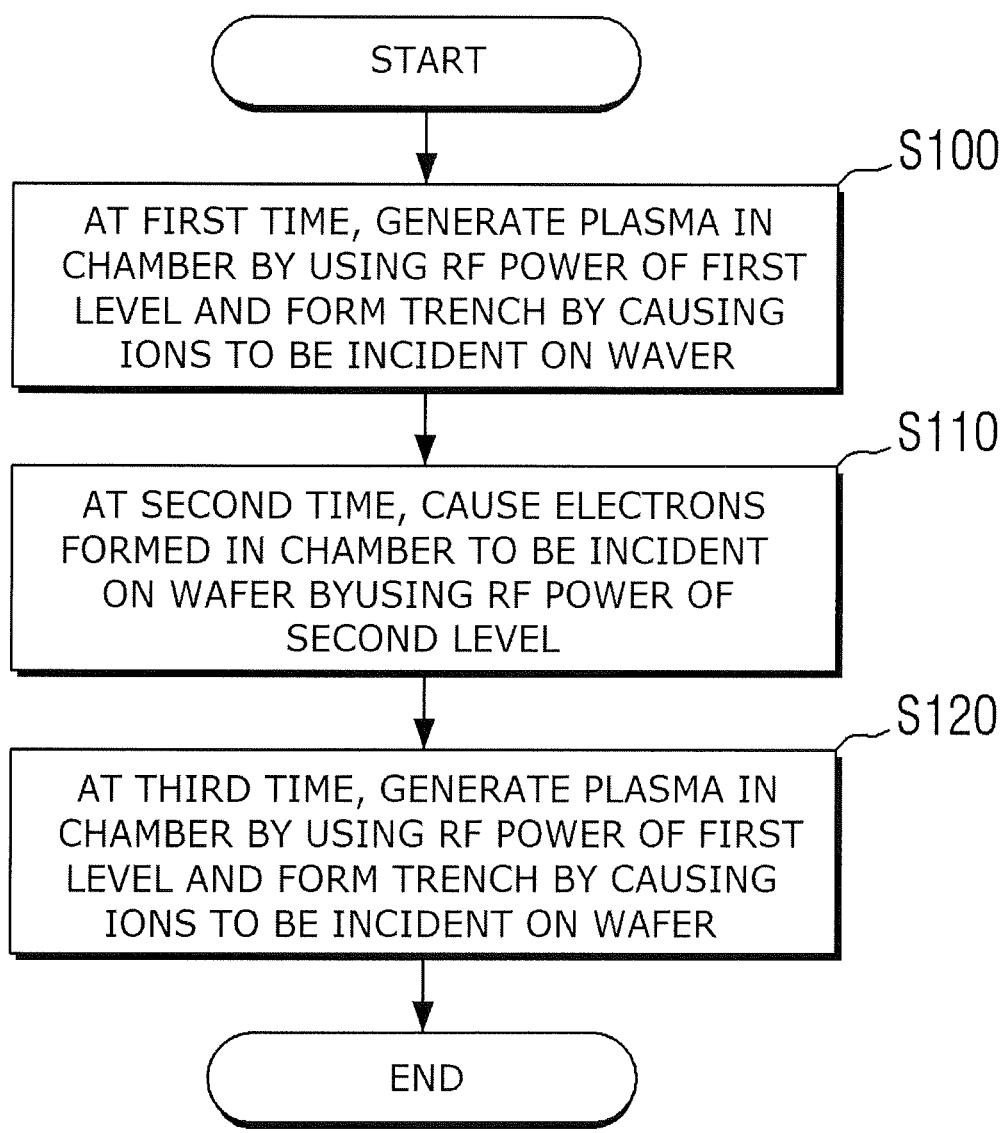
FIG. 10 is a flowchart illustrating a method of fabricating a semiconductor device using a plasma treatment apparatus according to embodiments.
Figure 11:
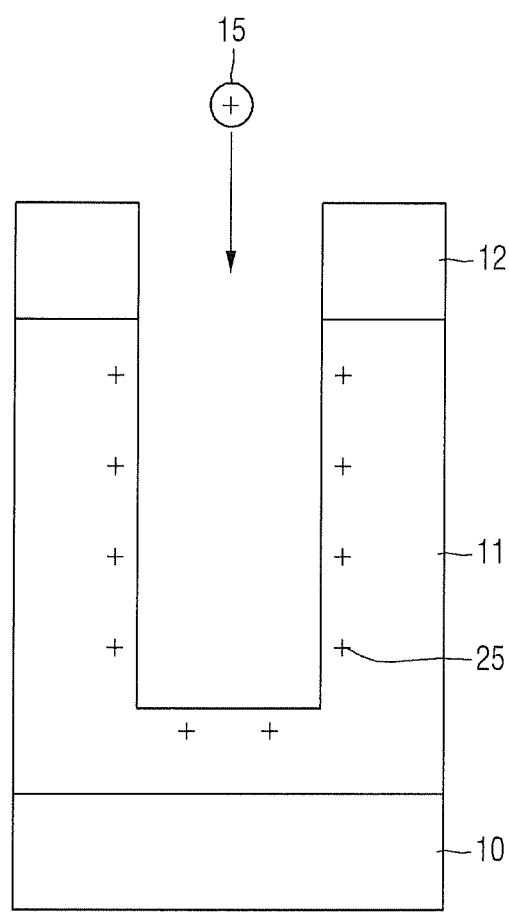
FIGS. 11 through 13 are conceptual diagrams for explaining the method of fabricating a semiconductor device using the plasma treatment apparatus according to the embodiments.
Figure 12:
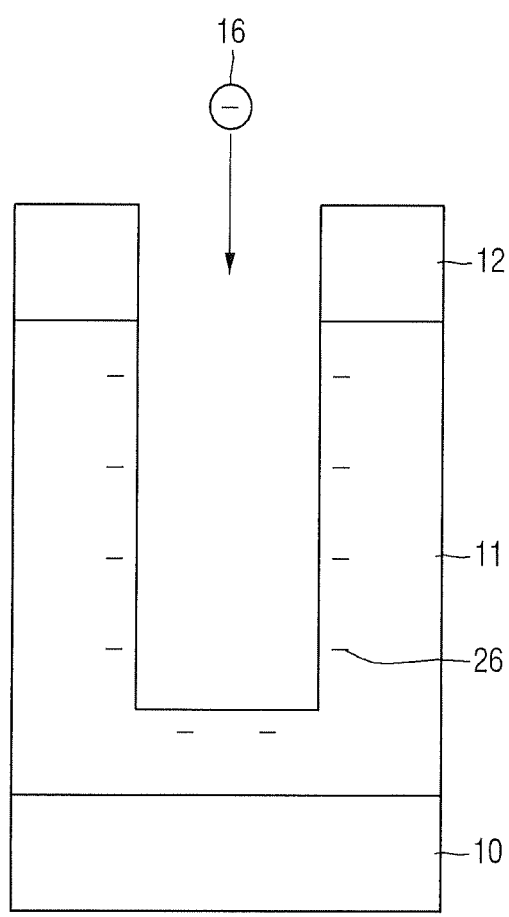
Figure 13:
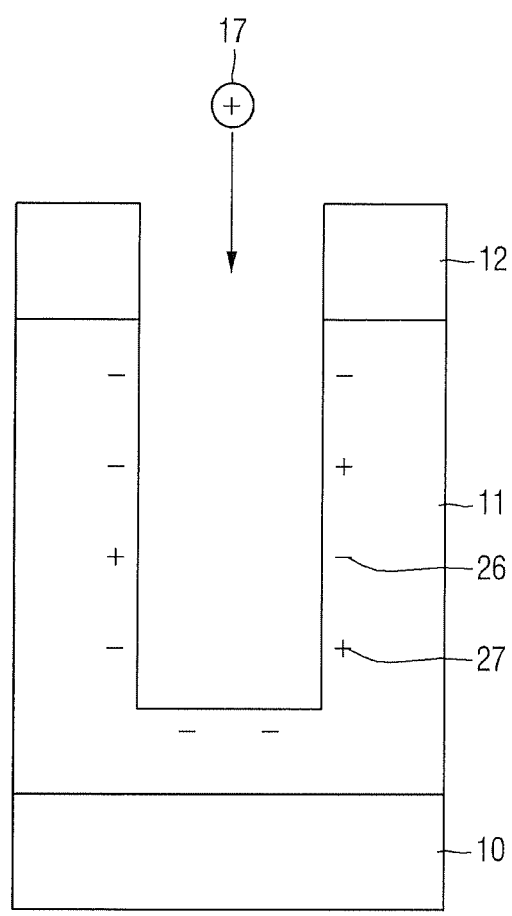

FIG. 10 is a flowchart illustrating a method of fabricating a semiconductor device using a plasma treatment apparatus according to embodiments. FIGS. 11 through 13 are conceptual diagrams for explaining the method of fabricating a semiconductor device using the plasma treatment apparatus according to the embodiments.

Referring to FIGS. 10 and 11, the method of fabricating a semiconductor device using the plasma treatment apparatus according to the embodiments includes, at a first time, generating plasma in a chamber by using an RF power output of a first level and forming a trench by causing ions to be incident on a wafer (operation S100).

Specifically, a mold film 11 disposed on a substrate 10 is etched using a mask 12. For example, the substrate 10 may be a silicon substrate, and the mold film 11 may be a silicon oxide film.

Due to a bias voltage applied by the bias power source 220, cations 15 are accelerated onto a wafer W to etch the mold film 11. The mold film 11 may be etched to form a trench. The cations 15 accelerated into the trench may cause positive charges 25 to accumulate on a bottom and sidewalls of the trench. The accumulated positive charges 25 may prevent the cations 15 having the same positive charge from entering the trench and hinder the etching of the mold film 11. Such a loading effect is not desirable especially in the case of forming a trench or pattern having a high aspect ratio.

Referring to FIGS. 10 and 12, the method of fabricating a semiconductor device using the plasma treatment apparatus according to the embodiments includes causing electrons formed in the chamber to be incident on the wafer by using an RF power output of a second level at a second time and causing the electrons formed in the chamber to be incident on the wafer by using the RF power output of the first level at a third time (operation S110).

Specifically, due to a pulse voltage applied by the pulse power source 230, electrons 16 are accelerated onto the wafer W to enter the trench. The electrons 16 entering the trench may cause negative charges 26 to accumulate on the bottom and sidewalls of the trench. The negative charges 26 may neutralize the bottom and sidewalls of the trench charged by the positive charges 25 and reduce the loading effect brought about by the positive charges 25.

Here, positively charged ions are also incident on the wafer W, but the amount of electrons incident on the wafer W is greater than the amount of ions i3 incident on the wafer W, as described above.

Referring to FIGS. 10 and 13, the method of fabricating a semiconductor device using the plasma treatment apparatus according to the embodiments includes, at the first time, generating plasma in the chamber by using the RF power output of the first level and forming a trench by causing ions to be incident on the wafer (operation S120).

That is, the application of the pulse voltage to the bottom electrode 110 is stopped at the third time, and only the bias voltage is applied from the bias power source 220 to the bottom electrode 110. Accordingly, the etching of the mold film 11 by the cations 15 is resumed. However, the accumulation of the negative charges 26 described above can reduce the loading effect and increase the efficiency of etching for forming a trench or pattern having a high aspect ratio.

The embodiments of the present inventive concept have been described with reference to the attached drawings, but it may be understood by one of ordinary skill in the art that the present inventive concept may be performed one of ordinary skill in the art in other specific forms without changing the technical concept or essential features of the present inventive concept. Further, the above-described embodiments are merely examples and do not limit the scope of the rights of the present inventive concept.

What is claimed is:

1. A plasma treatment apparatus comprising:
a chamber which provides a plasma treatment space;
a bottom electrode disposed in the chamber, wherein the bottom electrode supports a wafer;
a top electrode disposed in the chamber facing the bottom electrode;
a source power source which supplies a source power output of a first frequency to the bottom electrode;
a bias power source which supplies a bias power output of a second frequency different from the first frequency to the bottom electrode; and
a pulse power source which applies a pulse voltage to the bottom electrode,
wherein the bias power output is a bias voltage which is pulse-modulated to a first voltage level in a first time section and pulse-modulated to a second voltage level lower than the first voltage level in a second time section and is applied to the bottom electrode, and
wherein the pulse voltage has a third voltage equal to zero in the first time section and a positive voltage level in the second time section.

2. The plasma treatment apparatus of claim 1, wherein the second voltage level is higher than zero.

3. The plasma treatment apparatus of claim 1, wherein the pulse power source causes electrons generated from a plasma in the chamber to be incident on the wafer in the second time section.

4. The plasma treatment apparatus of claim 1, wherein the source power output is a source voltage which is pulse-modulated to a fourth voltage level in the first time section and pulse-modulated to a fifth voltage level lower than the fourth voltage level in the second time section and is applied to the bottom electrode.

5. The plasma treatment apparatus of claim 1, wherein the source power source is synchronized with the bias power source.

6. The plasma treatment apparatus of claim 1, wherein a plasma potential, increased at a first rising speed by the bias voltage, is formed in the chamber in the second time section, and a sheath potential, increased at a second rising speed by the pulse voltage, is formed adjacent to the wafer in the chamber in the second time section.

7. The plasma treatment apparatus of claim 6, wherein the second rising speed is greater than the first rising speed.

8. The plasma treatment apparatus of claim 6, wherein the second rising speed is about 2000 V/1 µs or more.

9. A plasma treatment apparatus comprising:
a chamber which provides a plasma treatment space;
a bottom electrode disposed in the chamber, wherein the bottom electrode supports a wafer;
a top electrode which is disposed in the chamber facing the bottom electrode;
a source power source which generates a plasma in the chamber by applying a source voltage of a first voltage level higher than zero to the bottom electrode in a first time section, the source voltage having a second voltage level equal to zero in a second time section;
a bias power source which supplies a bias power output to the bottom electrode, wherein the bias power source causes ions contained in the plasma to be incident on the wafer by applying a bias voltage of a third voltage level to the bottom electrode in the first time section and applying a bias voltage of a fourth voltage level lower than the third voltage level to the bottom electrode in the second time section; and
a pulse power source which causes electrons contained in the plasma to be incident on the wafer by applying a pulse voltage having a positive voltage level to the bottom electrode in the second time section, the pulse voltage having the second voltage level in the first time section.

10. The plasma treatment apparatus of claim 9, wherein the pulse voltage rises at a rising speed of about 2000 V/1 µs or more.

11. The plasma treatment apparatus of claim 9, wherein the top electrode is connected to a ground power source.

12. The plasma treatment apparatus of claim 9, wherein the source power source is synchronized with the bias power source.

13. The plasma treatment apparatus of claim 9, wherein the fourth voltage level is higher than zero.

* * * * *